United States Patent [19]
Takita et al.

[11] Patent Number: 5,206,543
[45] Date of Patent: Apr. 27, 1993

[54] BROADBAND SAMPLING GATE CIRCUIT CAPABLE OF ELIMINATING WAVEFORM DISTORTIONS IN TRACK HOLD MODE

[75] Inventors: Shintaro Takita; Masahiro Ohtaka; Kensuke Kobayashi, all of Tokyo, Japan

[73] Assignee: Iwatsu Electric Co., Ltd., Tokyo, Japan

[21] Appl. No.: 899,292

[22] Filed: Jun. 16, 1992

[30] Foreign Application Priority Data

Jun. 21, 1991 [JP] Japan ................... 3-177173

[51] Int. Cl.$^5$ ...................... H03K 5/151; H03K 5/153
[52] U.S. Cl. .................................. 307/352; 307/353; 307/358
[58] Field of Search ............... 307/352, 353, 355, 356, 307/357, 358, 521; 328/162, 167

[56] References Cited
U.S. PATENT DOCUMENTS 5,115,152  5/1992  Nishimura ..................... 307/490

Primary Examiner—William L. Sikes
Assistant Examiner—Sinh Tran
Attorney, Agent, or Firm—Oblon, Spivak, McClelland, Maier & Neustadt

[57] ABSTRACT

In a sampling gate circuit, a broadband and high-precision sampling gate circuit is realized by further employing first and second equivalent sampling networks which are equal to a sampling operation by a first sampling gate circuit. The first and second equivalent sampling networks compensate for distortions in the signal output by the first sampling gate circuit and allow an input waveform to be reproduced at high precision. The output from the first sampling gate circuit is input to a positive terminal of a differential amplifier. The outputs from the first and second equivalent sampling networks are input into two respective negative inputs of a differential amplifier, to cancel the distortions of the signal output from the first sampling gate circuit and input to the positive terminal of the differential amplifier. This device may find particular application in sampling type oscilloscopes or the like.

8 Claims, 9 Drawing Sheets

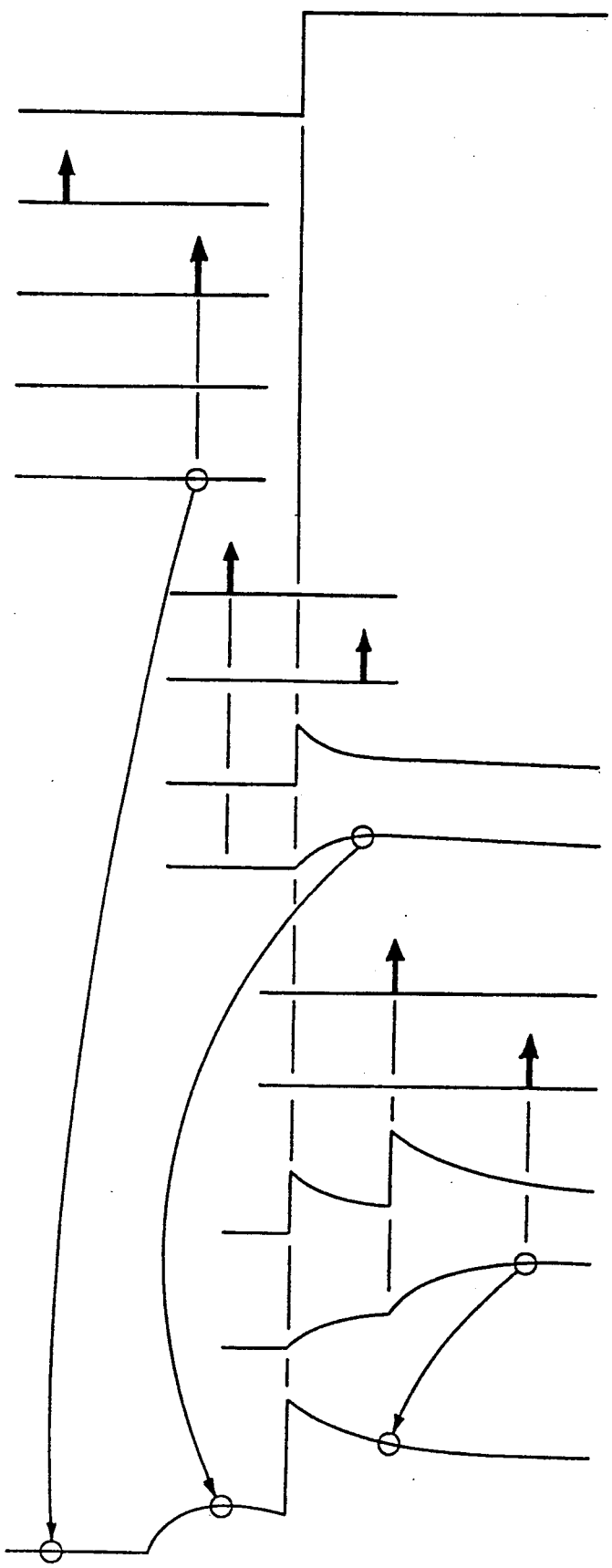
FIG. 2(a) 50 PRIOR ART
FIG. 2(b-1) S11 PRIOR ART
FIG. 2(c-1) 55 PRIOR ART
FIG. 2(d-1) C12 PRIOR ART
FIG. 2(e-1) C13 PRIOR ART
FIG. 2(b-2) S11 PRIOR ART
FIG. 2(c-2) 55 PRIOR ART
FIG. 2(d-2) C12 PRIOR ART
FIG. 2(e-2) C13 PRIOR ART
FIG. 2(b-3) S11 PRIOR ART
FIG. 2(c-3) 55 PRIOR ART
FIG. 2(d-3) C12 PRIOR ART
FIG. 2(e-3) C13 PRIOR ART
FIG. 2(f) 59 PRIOR ART FIG. 3(b) S11
PRIOR ART FIG. 3(d) C12
PRIOR ART FIG. 3(e) C13
PRIOR ART FIG. 3(f) C23
PRIOR ART

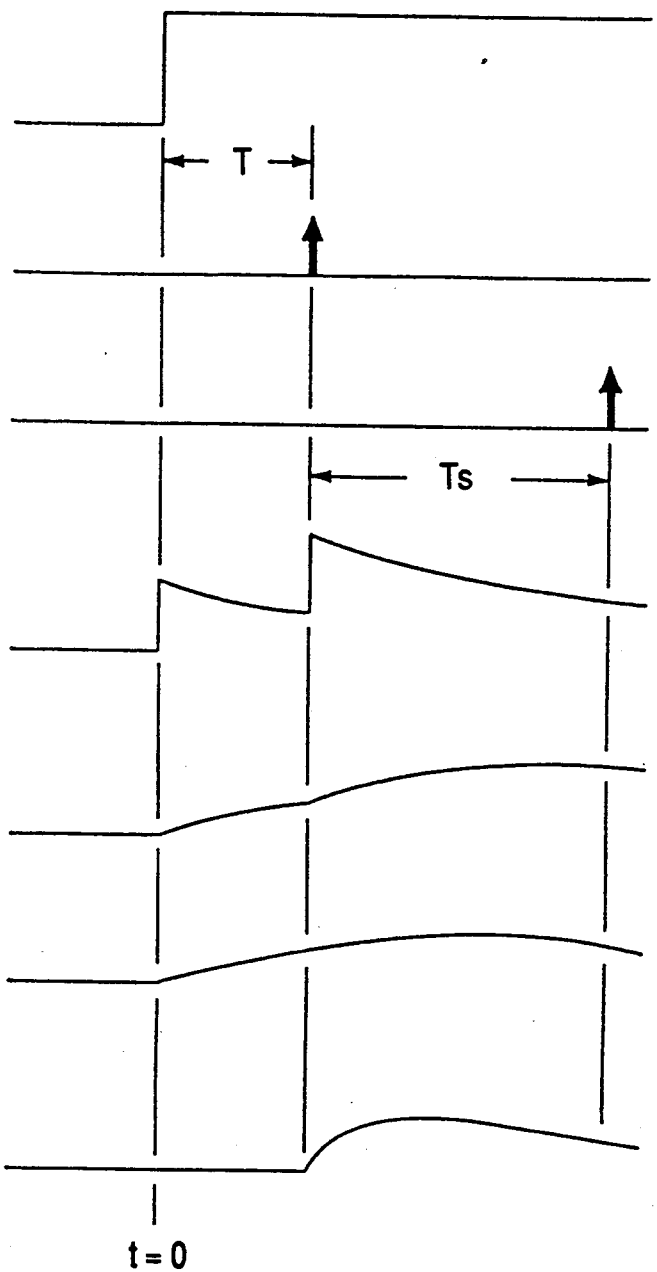

FIG. 8(b)   S11 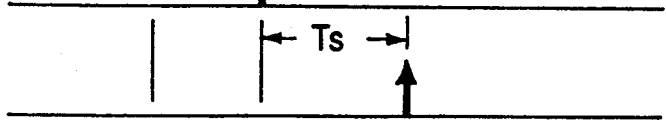
FIG. 8(c)   55
FIG. 8(d)   S31 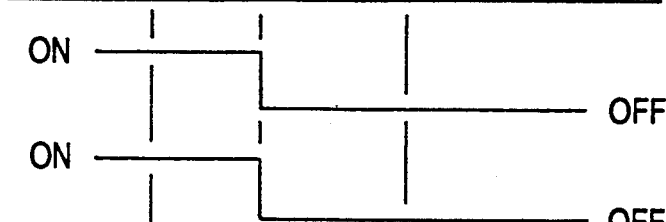
FIG. 8(e)   S32
FIG. 8(f)   C13 
FIG. 8(g)   C23 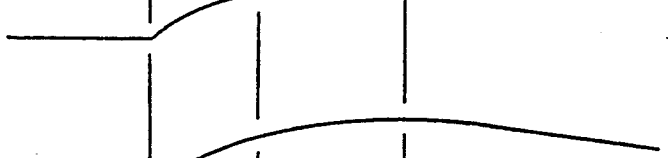
FIG. 8(h)   DIFFERENCE BETWEEN (f) AND (g) 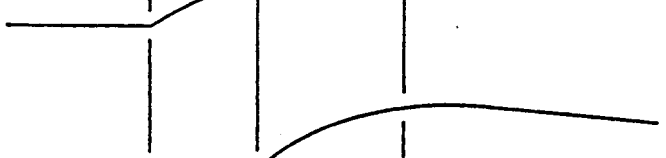
FIG. 8(i)   C32 
FIG. 8(j)   C33 

$t = 0$

BROADBAND SAMPLING GATE CIRCUIT CAPABLE OF ELIMINATING WAVEFORM DISTORTIONS IN TRACK HOLD MODE

BACKGROUND OF THE INVENTION

1. Field of the Invention

The present invent-ion generally relates to a broadband sampling gate circuit which may be employed in sampling type oscilloscopes and the like. More specifically, the present invention is directed to such a broadband sampling gate circuit in which waveform distortions in a low frequency region can be corrected for at high precision.

2. Discussion of the Background

In FIG. 1, there is shown a first conventional sampling gate circuit. Referring now to this drawing, operations of this first conventional sampling gate circuit will be described.

Reference numeral 50 indicates a signal source which generates, for instance, a signal having a stepped waveform as a signal to be measured. This stepped signal is supplied via a resistor R0 indicative of an internal impedance of this signal source 50, and via an input terminal 56 to a first sampling gate 11.

The first sampling gate 11 includes a switch S11, a resistor R11 indicative of an ON-resistance value when the switch S11 is turned ON, and a capacitor C11 representative of a capacitance value across an element (normally, a diode) employed as a gate element.

When the switch S11 is turned ON only during a short-time period, an amplitude component of the signal to be measured which has been supplied thereto via the resistors R0 and R11 is charged (memorized) into a capacitor C12. This operation is called a "sampling operation". The amplitude component of the signal to be measured, which has been charged into this capacitor C12, is gradually charged, via a resistor R12 having a sufficiently larger resistance than that of the resistor R0 or the resistor R11, to a capacitor C13 equal to both of an input capacitance of an amplifier 51B and a stray capacitance of a wiring pattern. An electron charge stored into the capacitor C13 is discharged by a resistor R13 having a sufficiently larger resistance than that of the resistor R12, and then reset to zero.

It should be noted that since the switch S11 is turned ON for a short time period and then the capacitor C12 is charged, and since the resistance value of the resistor R12 is sufficiently greater than that of the resistor R11, the presence of the resistor R12 gives substantially no effect to the charging operation to the capacitor C12, but this resistor R12 has a buffer function which separates the capacitor C12 from the capacitor C13.

The amplitude component of the signal to be measured, which has been charged into the capacitor C13, is amplified by a differential amplifier 51B, and again sampled by a second sampling gate 55, which is a so-called "stretcher", which is operated after a predetermined time period after the first sampling gate 11 has been turned ON, whereby a sampled output is obtained at an output terminal 59. It should be noted that the input signal applied to the first sampling gate 11 is also supplied to an equivalent network 20 having substantially equal attenuation values and time constants as the sampling network, with respect to the signal to be measured when the switch S11 is turned OFF, which is constructed of the first sampling gate 11, the capacitors C12 and C13, and the resistors R12, R13.

This equivalent network 20 includes an attenuator 25, capacitors C21, C23 and resistors R22, R23. The input signal which is equal to the signal to be measured is supplied from the input terminal 56 to an attenuator 25, and is then supplied via a series connection of a resistor R22 and a capacitor C21 to a parallel connection of a resistor R23 and a capacitor C23.

A signal appearing between terminals of the capacitor C13 is supplied to a positive (+) input terminal of the differential amplifier 51B, whereas a signal appearing between terminals of the capacitor C23 is inputted to a negative (−) input terminal of the differential amplifier 51B.

In the first sampling gate 11, when a time constant defined by a product between the capacitor C12 and a summation of the resistors R0 and R11 becomes small with respect to a time duration that the switch S11 is turned ON, the voltage appearing between the terminals of the capacitor C12 is equal to the voltage value of the signal to be measured during the sampling period. Such an operation state is referred to as a "track hold mode". To the contrary, when the time constant defined by the product of the capacitor C12 and the summation between the resistor R0 and R11 becomes large, the terminal Voltage Of the capacitor C12 is lower than the voltage of the signal to be measured during the sampling operation. Such an operation state is referred to as a "sample hold mode".

In FIG. 2, there are shown waveforms at various circuit portions in the first conventional sampling gate circuit indicated in FIG. 1 when the negative (−) input terminal of the differential amplifier 51B is grounded. For the sake of explanation, these waveforms appear in the case that the waveform of the signal source 50 is a stepped signal in the track hold mode. FIG. 2a represents the stepped waveform of the signal source 50. FIG. 2(b-1) represents that the stepped waveform of the signal source 50 shown in FIG. 2a is sampled when the switch S11 of the first sampling gate 11 is turned ON for a short time period at a time instant indicated by an arrow. Since this sampling operation is performed at a portion where the amplitude of the stepped waveform shown in FIG. 2a is zero, there is no influence in the waveform appearing across the capacitor C12, as shown in FIG. 2(d-1). A short time after the switch S11 is operated (FIG. 2(b-1)), as shown in FIG. 2(c-1), another sampling operation is performed while the second sampling gate 55 is operated. At this time, as shown in FIG. 2(e-1), since no signal appears at the terminals of the capacitor C13, there is no signal waveform on the reproduced waveform shown in FIG. 2(f) which has been reproduced by sampling this signal.

FIG. 2(b-2) indicates such an operation that the switch S11 is operated just before the stepped waveform shown in FIG. a is raised, whereas FIG. 5(c-2) represents such an operation that the second sampling gate 55 is operated just after the stepped waveform shown in FIG. 2a is raised. It should be noted that an electrostatic capacitance, as indicated as the capacitor C11, is present across terminals of a high speed switching diode employed in the first sampling gate 11. As a result, when the stepped waveform shown in FIG. 2a is supplied from the signal source 50, although the switch S11 is turned OFF, the capacitor C12 is charged via the resistor R11 and the capacitor C11, and thus a waveform as shown in FIG. 2(d-2) appears across the terminals of the capacitor C12. A time constant of charge-up operation at this time is defined by a product between the resistor R0 and the series circuit of the capacitor C11 and C12. During this charge-up operation, substantially no current flows through the resistor R12 and this circuit functions as a buffer.

After the capacitor C12 is charged up as shown in FIG. 2(d-2) and the charged electrons have reached their peak value, the capacitor C13 is charged via the resistor R12 and the charged voltage is raised as shown in FIG. 2(e-2). A time constant during this raising period is equal to a product between the resistor R12 and the capacitor C13. The waveform appearing across the terminals of the capacitor C12, shown in FIG. 2(d-2), is also lowered due to the discharge operation via the resistor R12 in connection with the charge-up operation of the capacitor C13. After the capacitor C13 has been charged up, this capacitor C13 is gradually discharged via the resistor R13. Then, since the second sampling gate 55 is operated as shown in FIG. 2(c-2), and the waveform appearing across the terminals of the capacitor C13, shown in FIG. 2(e-2), is sampled, the resultant reproduction waveform is obtained as indicated in FIG. 2(f).

FIG. 2(b-3) represents such a state that the switch S11 is turned ON only for a short time period slightly after the stepped waveform of the signal source 50 shown in FIG. 2a is raised and then the sampling operation is carried out. As shown in FIG. 2(d-3), a waveform across the terminals of the capacitor C12 is equal to that shown in FIG. 2(d-2) until the switch S11 of FIG. 2(b-3) is operated. When the switch S11 is turned ON only for a short time period at the time instant shown in FIG. 2(b-3), and the sampling operation is carried out, the capacitor C12 is charged until the potential of this capacitor C12 becomes a potential equal to the amplitude of the stepped waveform of the signal source 50 shown in FIG. 2a irrelevant of the potential of the capacitor C12 before the sampling operation. Thereafter, since the capacitor C13 is charged via the resistor R12, the waveform appearing across the capacitor C12 is lowered due to the discharge operation as shown in FIG. 2(d-3), and then the waveform appearing across the terminals of the capacitor C13 is increased due to the charge operation as shown in FIG. 2(e-3). Since the resistance value of the resistor R13 is sufficiently larger than that of the resistor R12, the waveform appearing across the terminals of the capacitor C13 shown in FIG. 2(e-3) is reduced due to the discharge operation outside the right hand of this figure. A time constant while the capacitor C13 is charged/discharged is much greater than that when the switch S11 is turned ON within a short time period. Then, at a time instant as shown in FIG. 2(c-3), since the second sampling gate 55 is operated and also the waveform of the capacitor C13 as shown in FIG. 2(e-3) is sampled, the resultant waveform is represented in FIG. 2(f). This reproduced waveform shown in FIG. 2(f) has a waveform distortion, a so-called "blowby" distortion, which is different from the stepped waveform as represented in FIG. 2(a).

The above-described operation is effected in such a case that the negative (−) input terminal of the differential amplifier 51B is grounded, namely there is no equivalent 2(f), there is provided the equivalent network 20. Thus, operations of the equivalent network 20 shown in FIG. 1 will now be explained.

Since amplitudes of the signals sampled by the sampling operations of both the first and second sampling gates 11 and 55 become zero when the sampling operations of the first sampling gate 11 and the second sampling gate 55 are carried out before the stepped waveform of the signal source 50 is raised, the voltages appearing across the terminals of the capacitors C13 and C23 are equal to zero, and further the output from the differential amplifier 51B is equal to zero.

In FIG. 3, there is shown such a case that before the stepped waveform of the signal source 50 (see FIG. 2) is raised up (see FIG. 3a), the switch 11 is operated (see FIG. 3b), whereas after the stepped waveform has been raised, the second sampling gate 55 of FIG. 3(c) is operated. A sampling result by the switch S11 of the first sampling gate 11, as shown in FIG. 3(b), is equal to zero, as represented in FIG. 3(d), of the waveform of the capacitor C12. Thereafter, since the stepped waveform of the signal source 50 shown in FIG. 3(a) is raised, electron charges are charged C11 to the capacitor C12, so that a waveform shown in FIG. 3(d) appears. The electron charges stored in the capacitor C12 are transferred via the buffering resistor R12 to the storage capacitor C13. As a result, the voltage across the terminals of the capacitor C13 are applied to the positive (+) input terminal of the differential amplifier 51B, whereby an exponential waveform appears as shown in FIG. 3(e). Also, the same exponential waveform is outputted from the equivalent network 20 and a voltage across the terminals of the capacitor C23 included in the equivalent network 20 is applied to the negative (−) input terminal of the differential amplifier 51B, and then a waveform shown in FIG. 3(f) is inputted, so that no output signal is derived from the differential amplifier 51B (see FIG. 3g). If this is sampled at the timing of the second sampling gate 55 as shown in FIG. 3(c), a point (corresponding to a point indicated by a round mark in FIG. 3(g)) is indicated on the stepped waveform of the signal source 50 shown in FIG. 3(a).

In FIG. 4, there is shown such a state that after a time period "T" has passed since the stepped waveform of the signal source 50 shown in FIG. 4(a) was raised, the switch S11 shown in FIG. 4(b) and the second sampling gate 55 shown in FIG. 4(c) are operated. When the stepped waveform of the signal source 50 shown in FIG. 4(a) is raised up, the electron charges are transferred to the capacitor C12 so that a first peak waveform as indicated by FIG. 4(d) is produced. A voltage across the terminals of the capacitor C13 has such a waveform shown in FIG. 4(e) under such a state that the capacitor C13 is charged via the resistor R12 having the buffer function by the waveform shown in FIG. 4(d).

On the other hand, since the stepped waveform derived from the signal source 50 as shown in FIG. 4(a) is supplied via the attenuator 25, capacitor C21 and resistor R22 to a parallel circuit between the capacitor C23 and the resistor R23, a waveform of the voltage across the terminals of the capacitor C23 becomes the same waveform as the voltage across the terminals of the capacitor C13 shown in FIG. 4(e) during time period "T", and as the waveforms shown in FIGS. 4(e) and 4(f) are applied to the differential amplifier 51B, the output derived from the differential amplifier 51B remains zero during the time period "T" as shown in FIG. 4(g). When the sampling operation is carried out by operating the switch S11 shown in FIG. 4(b), the potential at the capacitor C12 is equal to a potential value of the input signal derived from the signal source 50 shown in FIG. 4(e) under operation of the track hold mode. Here, the electron charges stored into the capacitor C12 are transferred to the capacitor C13, so that a waveform portion as shown in FIG. 4(e) appears during a period of "Ts" at the positive (+) input terminal of the differential amplifier 51B.

A signal waveform appearing between the terminals of the capacitor C23 during the time period "Ts" shown in FIG. 4(f) is applied to the negative (−) input terminal of the differential amplifier 51B via the equivalent network 20. A time constant of the signal waveform shown in FIG. 4(f) is equal to that of the signal waveform shown in FIG. 4(e). Since an amplitude of a signal stored in the capacitor C13 becomes large, as shown in FIG. 4(d), in response to the operation of the switch S11 an amplitude of the signal shown in FIG. 4(f) is smaller than that of the signal shown in FIG. 4(e). As a consequence, a signal shown in FIG. 4(g) is obtained from the output of the differential amplifier 51B. However, it is apparent that a component to preventing the input signal shown in FIG. 4(a) from being faithfully reproduced is contained in a signal component (see FIG. 4g) obtained by amplifying a difference between the signal waveforms shown in FIGS. 4(e) and 4(f), namely a difference signal. Therefore, equivalent circuits in various cases from which the equivalent network 20 of FIG. 1 has been removed are represented in FIG. 5, and will now be analyzed as follows.

In FIG. 5, resistance values of the resistors R12, R13 are indicated by $R_{12}$, $R_{13}$; capacitance values of the capacitors C13, C15 are denoted by $C_{13}$, $C_{15}$; and voltages of the equivalent voltage sources V1 to V14, V21 to V23 are represented by $V_{11}$ to $V_{14}$, $V_{21}$ to $V_{23}$, respectively. It should be noted that the capacitor C15 corresponds to a parallel circuit constructed of the capacitors C11 and C12 (see FIG. 1).

As a preparation, a response is obtained in such a case that an electron charge "Q" is suddenly applied to the capacitor C15 of the circuit shown in FIG. 5(a). A voltage $V_{10}(t)$ appearing across the terminals of the capacitor C15 is expressed by the following equation (1):

$$V_{10}(t) = (Q/C_{15})[1 + A(\alpha - \beta)^{-1}(AB + CD)] \quad (1)$$

wherein
$C_{15} = C_{11} + C_{12}$ $A = C_{15}C_{13}R_{12}R_{13}$ $B = \alpha \exp(-\alpha t) - \beta \exp(-\beta t)$ $C = \exp(-\alpha t) - \exp(-\beta t)$ Symbols "$\alpha$" and "$\beta$" are given by the following equations (2) and (3):

$$\alpha = \{-e + (e^2 - 4A)^{\frac{1}{2}}\}/(2A) \quad (2)$$

$$\beta = \{-E - (E^2 - 4A)^{\frac{1}{2}}\}/(2A) \quad (3)$$

wherein $E = C_{15}R_{12} + C_{13}R_{13} + C_{15}R_{13}$

The term "$E^2 - 4A$" in the above equations (2) and (3) is given as follows:
That is to say, assuming now:

$G^2 = (c_{15}R_{12} - C_{13}R_{13})^2$ $H^2 = (C_{15}/R_{13})^2$ $I = C_{15}C_{13}R_{13}2$ $J = C_{15}2R_{12}R_{13}$, since $G^2 \geq O$, $H^2 > O$, $I > O$, $J > O$, it is given $E^2 - 4A = G^2 + H^2 + 2I + 2J > O$ Symbols "$\alpha$" and "$\beta$" are real numbers.

Also, at this time, a voltage $V_{20}(t)$ appearing across the terminals of the capacitor C13 is expressed by:

$$V_{20}(t) = [Q/(C_{15}C_{13}R_{12}R_{13})](\beta - \alpha)^{-1}D \quad (4)$$

Assuming now that the raising time instant "t" of the stepped waveform shown in FIG. 4(a) is equal to "O", when the sampling operation is carried out at a time instant "T" (T>O) after the raising time of the stepped waveform, the circuit state immediately before the sampling operation is expressed by employing the above equations (1) and (4) as follows:

$V_{11} = (C_{11}/C_{15})V_{10}T$ $V_{21} = (C_{11}/C_{15})V_{20}T$

This circuit state is shown in FIG. 5(b).

Under this condition, if the sampling operation is performed in the track hold mode, the potential of the storage capacitor C12 becomes equal to the step voltage applied to the input terminal 56. On the other hand, the electron charges stored in the capacitor C13 are essentially neither charged nor discharged while the switch S11 is turned ON, assuming now that the ON-time period of the switch S11 is considerably shorter than the time constant $C_{13}$, $R_{13}$. As a consequence, it is assumed that the electron charges just before the switch S11 is turned ON for a short time period are reserved until the time "T" when the switch S11 is turned ON.

Assuming now that the amplitude of the stepped waveform applied to the input terminal 56 is equal to 1, the voltages $V_{12}$ and $V_{22}$ of the equivalent voltage sources V12 and V22 are given as follows:

$V_{12} = 1$ $V_{22} = (C_{11}/C_{15})V_{20}(T)$

This state is shown in FIG. 5(c).

The state of FIG. 5(c) may be expressed as a summation of FIGS. 5(d) and 5(e) with employment of the "principle of superposition", in which the voltages are given:

$V_{13} = 1 - (C_{11}/C_{15})V_{10}(T)$ $V_{14} = (C_{11}/C_{15})V_{10}(T)$ $V_{13} = (C_{11}/C_{15})V_{20}(T)$

Since the voltage response related to the resistor R13 shown in FIG. 5(e) is equal to such a response that no sampling operation is performed at the first sampling gate 11, it is given by:

$V_{R13} = (C_{11}/c_{15})V_{20}(T)$

As this response is coincident with the output response of the equivalent network 20 for correcting the "blowby" distortions, only a response by FIG. 5(d) appears at the output terminal of the differential amplifier 51B by canceling the response by FIG. 5(e).

The output response of FIG. 5(d) is obtained by employing the above equation (4) as follows:

$$V_{AB} = [1 - (C_{11}/C_{15})V_{10}(T)]V_{20}(t-T) \quad (5)$$

The result is represented in FIG. 4(g).

In FIG. 4, it is now assumed that a time period from the operation of the switch S11 to the operation of the second sampling gate 55 is defined as "Ts", a sampling time instant "t" by the second sampling gate 55 is determined by:

$$t = T + Ts$$

Accordingly, when this time period "Ts" is introduced into the above equation (5), it is obtained:

$$V_{AB}(\text{RESULT}) = \{1 - (C_{11}/C_{15})V_{10}(T)\}V_{20}(Ts) \quad (6)$$

Although the above-described equation (6) represents the sampled output derived from the output terminal 59 (see FIG. 1), it indicates that it does not immediately become a constant value after the stepped waveform (see FIG. 4a) is raised at T=0. This is because the term $[1 - (C11/C15)V_{10}(T)]$ is dependent upon the time "T" contained in this equation. This may result in a waveform having such distortions as shown in FIG. 6(b) being reproduced with respect to an input of a stepped waveform of the signal source 50 shown in FIG. 6(a). It should be noted that rounded points shown in FIG. 6(b) indicate sampling points.

Since the first sampling gate 11 (see FIG. 1) has a leakage capacitance C11, the signal to be measured is leaked. The distortions caused by sampling it with the second sampling gate 55 can be canceled by the output derived from the equivalent network 20. However, in case of the track hold mode, distortions different from the first-mentioned distortions caused by this leakage signal, which is produced by sampling the input signal in the first sampling gate, are remarkably produced, whereby there is a problem that the waveform as represented in FIG. 6(b), which is different from the original waveform, is reproduced.

A major cause of an occurrence of such distortions in the reproduced waveform is that the above equation (6) owns the term $V_{10}(T)$ depending on the time "T".

SUMMARY OF THE INVENTION

Accordingly, one object of this invention is to provide a novel sampling gate circuit which can accurately and efficiently reproduce a sampled signal waveform.

In order to achieve this objective, in accordance with the present invention, an equivalent sampling network containing a switch is newly employed, so that both of the functions $V_{10}(T)$ and the voltage $V_{20}(T)$ (see equation 4) corresponding to the function for "t" produced in the capacitor C13 are induced. Then, this voltage is applied to a second negative (−) input terminal of a differential amplifier having two negative (−) input terminals. The present invention then operates to remove distortions contained in a reproduced waveform to thereby accurately reproduce a sampled waveform.

As a consequence, since the equivalent sampling network of the present invention produces both the function $V_{10}(T)$ and $V_{20}(T)$ and the waveform of the distortion portion in the reproduced waveform can be outputted, this output is supplied to the second negative (−) input terminal of the differential amplifier, so that it is possible to obtain a signal waveform which faithfully resembles the original signal waveform.

BRIEF DESCRIPTION OF THE DRAWING

A more complete appreciation of the invention and many of the attendant advantages thereof, will be readily obtained as the same becomes better understood by reference to the following detailed description when considered in connection with the accompanying drawings, wherein:

FIG. 2(a)-2(f) shows waveforms appearing in various circuit portions of the conventional sampling gate circuit shown in FIG. 1;

FIG. 3(a)-3(g) represents waveforms appearing in various circuit portions of the conventional sampling gate circuit shown in FIG. 1, under such conditions that the first sampling gate is operated before the stepped waveform is raised, and also the second sampling gate is operated after the stepped waveform is raised;

FIG. 4(a)-4(g) indicates waveforms of various circuit portions in the conventional sampling gate circuit under such conditions that both of the first and second sampling gates are operated after the stepped waveform has been raised;

DESCRIPTION OF THE PREFERRED EMBODIMENTS

Figure 1:
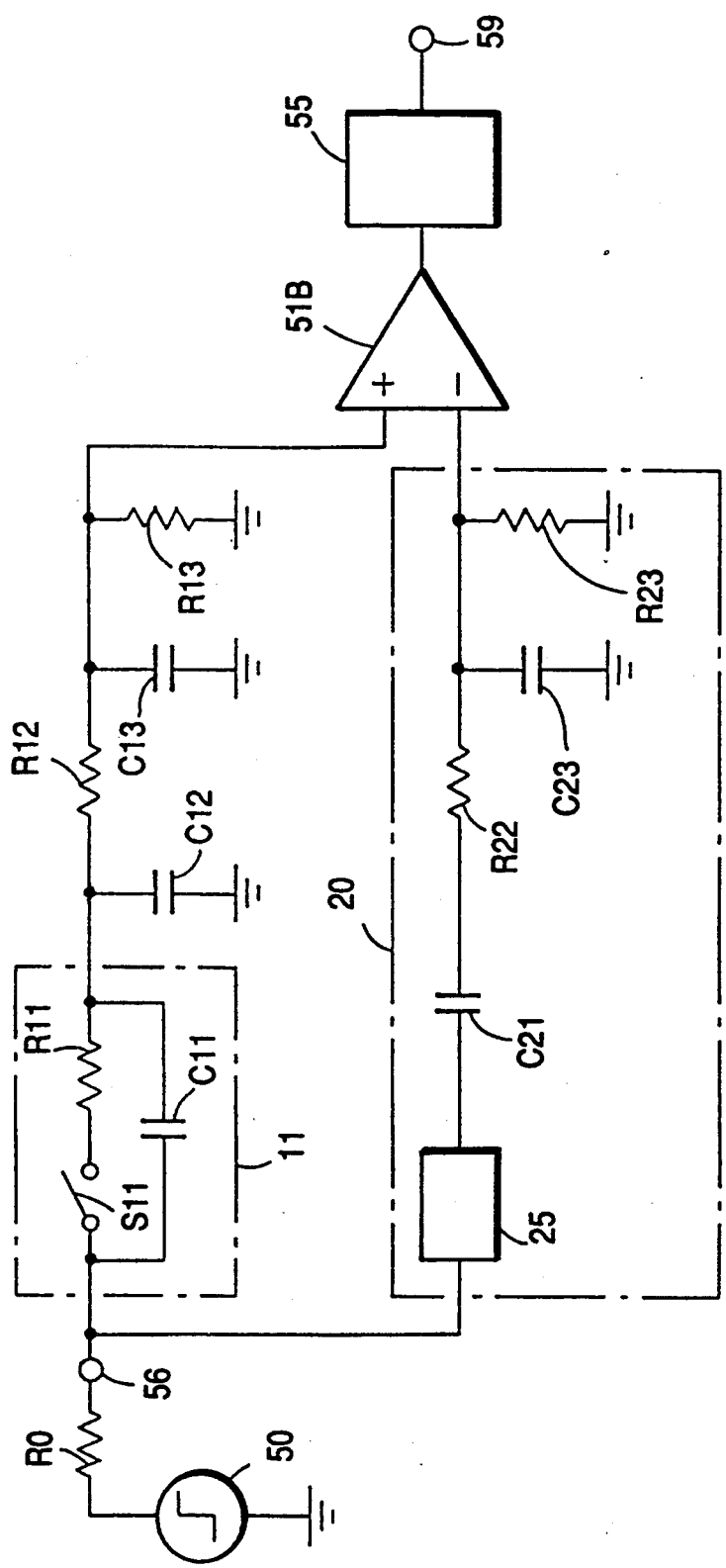
FIG. 1 is a schematic circuit diagram of a conventional sampling gate circuit.
Figures 3A, 3C, 3G:
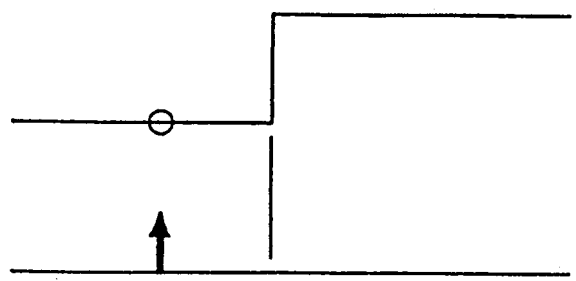
Figure 5A:
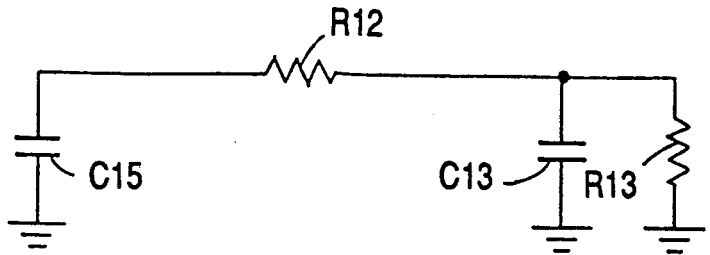
FIG. 5(a)-5(e) shows equivalent circuits under various cases.
Figure 5B:
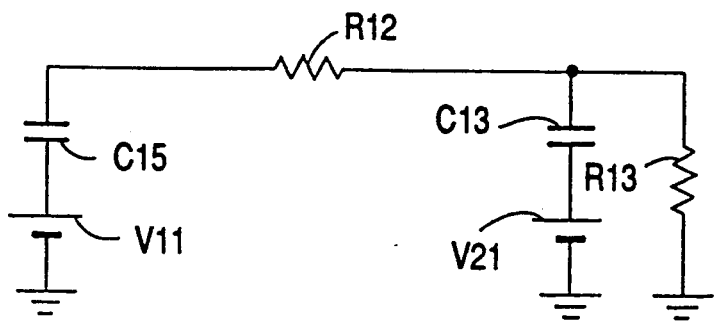
Figure 5C:
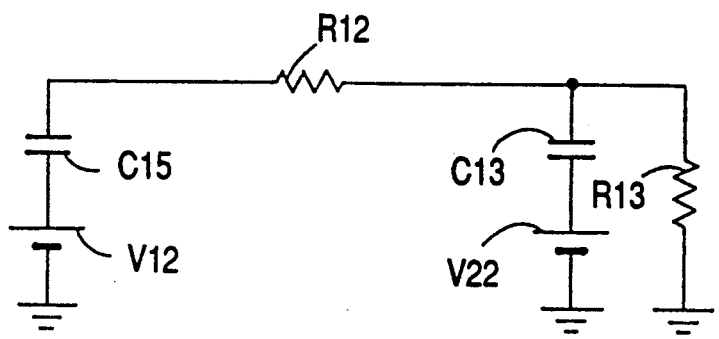
Figure 5D:
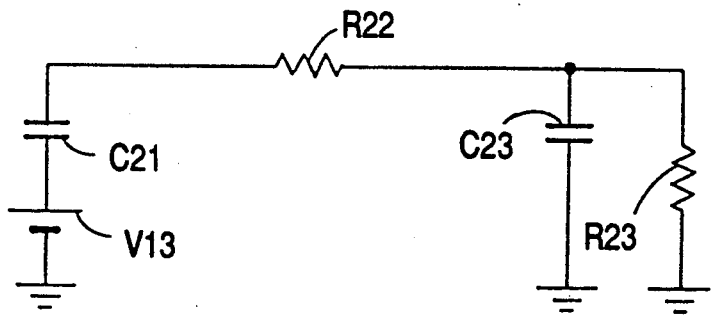
Figure 5E:
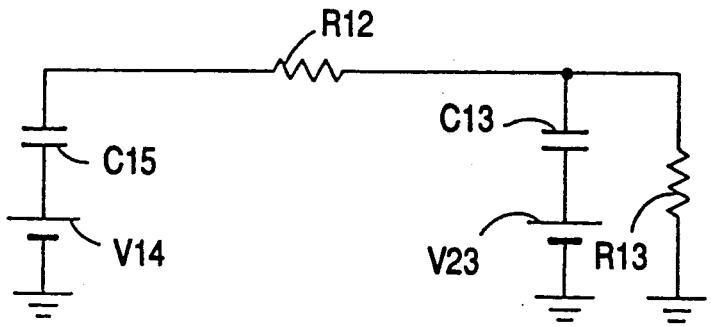
Figure 6A:
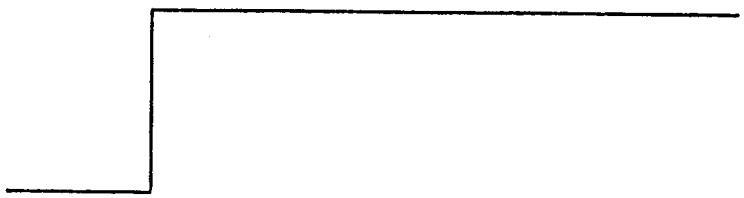
FIG. 6(a)-6(b) represents waveforms for showing distortions caused in the conventional sampling gate circuit operated in a track hold mode.
Figure 6B:
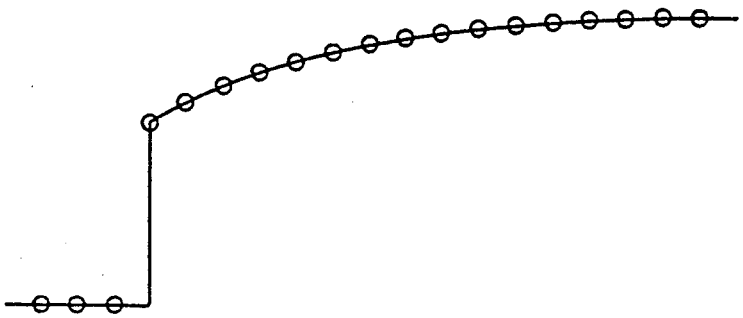

Referring now to the drawings, wherein like reference numerals designate identical or corresponding parts throughout the several views, and more particularly to FIG. 7, which details a broadband sampling gate circuit according to a preferred embodiment of the present invention which will now be described.

Figure 7:
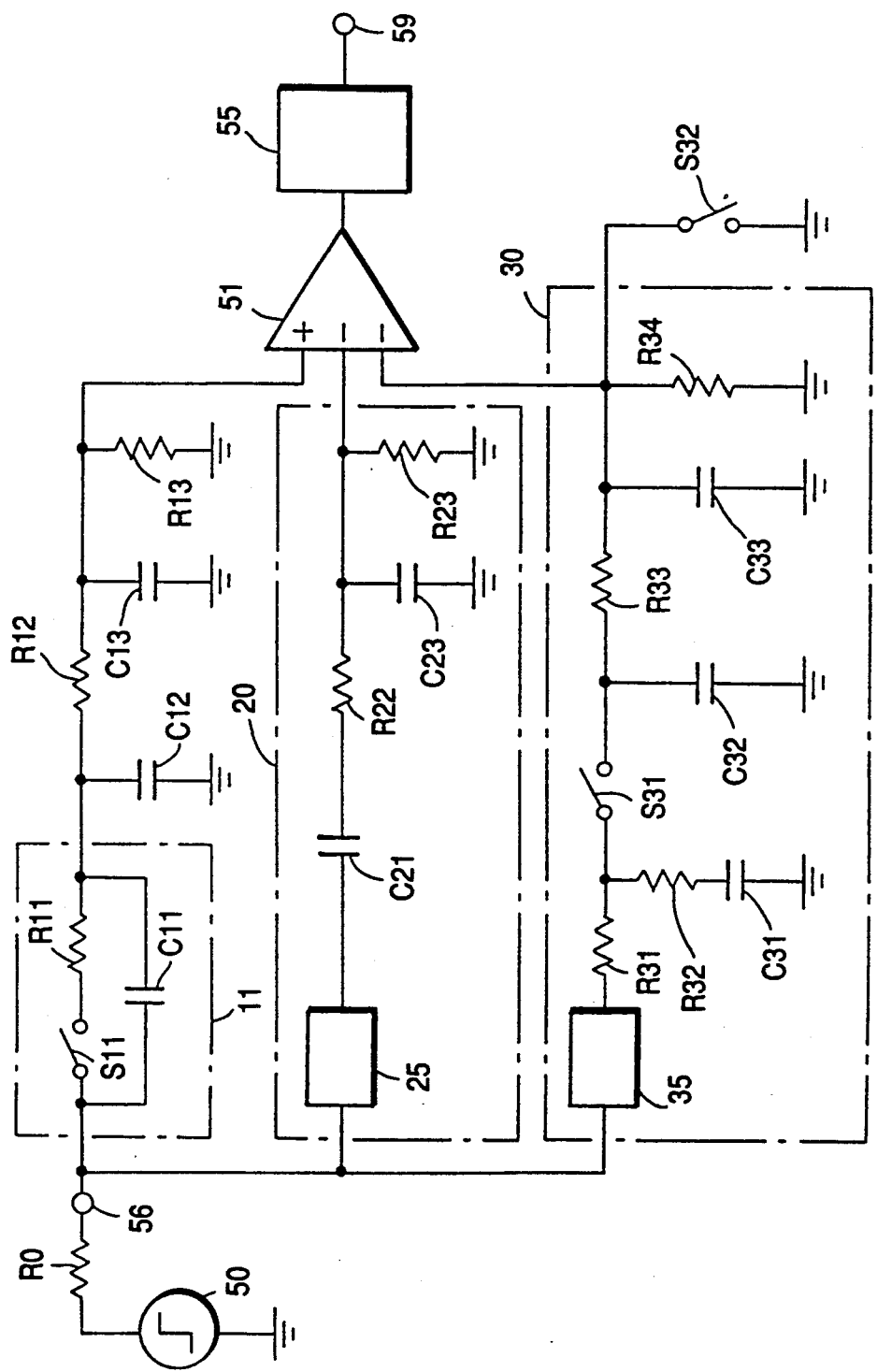
FIG. 7 is a schematic circuit diagram of a broadband sampling gate circuit according to a preferred embodiment of the present invention.

In the broadband sampling gate circuit shown in FIG. 7, a signal to be measured, which is supplied to the input terminal 56, is supplied not only to a first sampling gate 11 and an equivalent network 20, but also to a further equivalent sampling network 30. This equivalent sampling network 30 includes an attenuator 35, resistors R31 to R34, capacitors C31 to C33, and a switch S31. An output of this equivalent sampling network 20 is connected to a second negative (−) input terminal of a differential amplifier 51 having the first negative (−) input terminal connected to the other equivalent network 20. The output of the equivalent network 30 may be short circuited by way of a switch S32.

Figure 8A:
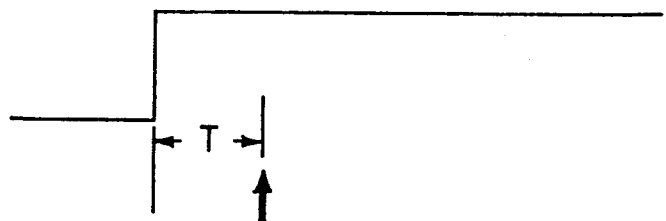
FIG. 8(a)-8(e) represents waveforms appearing at various circuit portions in the broadband sampling gate circuit of FIG. 7.

In FIG. 8, there are shown waveforms appearing in various circuit portions of the broadband sampling gate circuit shown in FIG. 7. FIG. 8(a) indicates a stepped waveform of the signal source 50 shown in FIG. 7. This waveform represents that assuming now that a rising time "t" is equal to "O", the switch S11 of the first sampling gate is operated after a time period "T" (see FIG. 8b), and thereafter the second sampling gate 55 is operated after another time period Ts (see FIG. 8c). Both of the switch S31 (see FIG. 8d) and the switch S32 (see FIG. 8e) are changed from ON states to OFF states at the same time when the switch S11 (see FIG. 8b) is operated. FIGS. 8(f) and 8(g) represent waveforms of voltages appearing across the terminals of the capacitors C13 and C23. Since both waveforms are coincident with each other at the time period "T", a difference between these waveforms becomes zero at the time period "T", as indicated in FIG. 8(h). This difference is obtained from the differential amplifier 51. FIG. 8(i) represents a waveform of a voltage appearing across the terminals of the capacitor C32. This capacitor C32 is gradually charged during the time period "T".

Figure 9A:
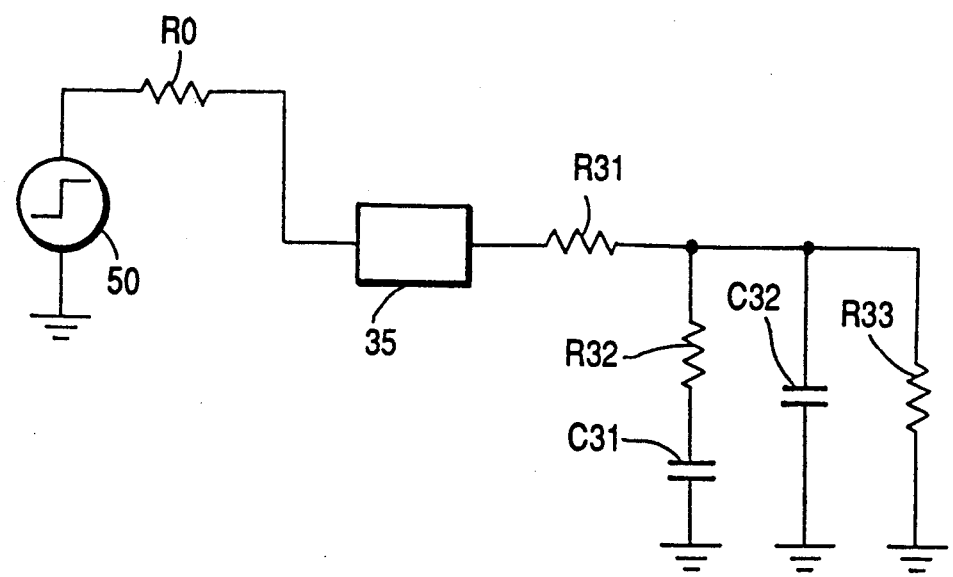
FIG. 9(a)-9(b) is an equivalent circuit of an equivalent sampling network employed as a major circuit element for the broadband sampling gate circuit shown in FIG. 7.
Figure 9B:
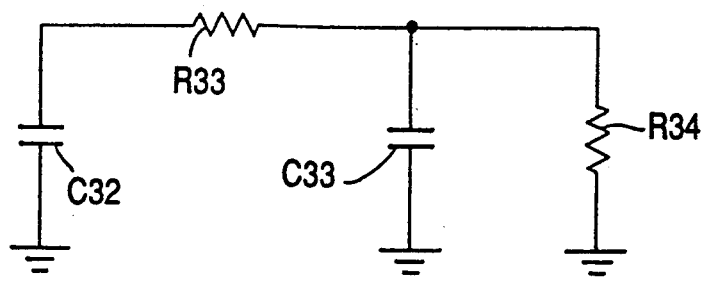

In FIG. 9(a), there is shown an equivalent circuit of the equivalent sampling network 30 under ON-conditions of the switches S31 and S32, namely under such a condition before the switch S11 shown in FIG. 8(b) has been operated. In FIG. 9(b), there is represented an equivalent circuit of the equivalent sampling network 30 under OFF-states of the switches S31 and S32, namely under such a condition after the switch S11 of FIG. 8(b) has been operated.

Assuming now that an attenuation ratio of the attenuator 35 is selected to be "$A_{+35}$" and an impedance of this attenuator is sufficiently low, a voltage $V_{C32(t)}$ appearing across the terminals of the capacitor C32 represented in FIG. 9(a) is expressed by the following equation (7):

$$V_{C32(t)} = A_{+35}[S + (\gamma - \delta)\{SP + UV\}] \quad (7)$$

where $$\gamma = (-W + (W^2 - 4S)^{\frac{1}{2}})/2S \quad (8)$$

$$\gamma = (-W - (W^2 - 4S)^{\frac{1}{2}})/2S \quad (9)$$

$$S = C_{31}C_{32}R_{32}R_{35}$$

$$P = \gamma \exp(-\gamma t) - \delta \exp(-\delta t)$$

$$U = (C_{31} + C_=)(R_{32} + R_{35})$$

$$V = \exp(-\gamma t) - \exp(-\delta t)$$

$$W = C_{32}R_{32} + C_{31}R_{35} + C_{31}R_{32}$$

$$R_{35} = R_{31}R_{33}/(R_{31} + R_{33})$$

It should be noted that when symbol "K" is assumed as an arbitrary positive proportional constant, it is determined as follows:

$$1/C_{32} = KC_{15} \quad (11)$$

$$1/C_{31} = KC_{13} \quad (12)$$

$$R_{35} = KR_{12} \quad (13)$$

$$R_{32} = KR_{13} \quad (14)$$

where $$C_{15} = C_{11} + C_{12}$$

Accordingly, the equation (7) is coincident with the function $V_{100(t)}$ of the equation (1) except for the proportional constant part and the constant term part thereof. Since the function $V_{10(t)}$ corresponds to such a function for causing waveform distortions in the equation (6), at a time instant $t = T$, namely when the signal to be measured is sampled by the first sampling gate 11, if the switch S11 is turned OFF, the electron charges directly proportional to such a term for causing the distortions in the equation (7) may be sampled at the capacitor C32.

In order to apply to the differential amplifier 51 the electron charges which have been stored into the capacitor C32 by the sampling operation at the same time when the switch S31 is changed from the ON state to the OFF state, the switch S32 is also changed from the ON state to the OFF state. An equivalent circuit of the equivalent m sampling network 30 under this condition is shown in FIG. 9(b). Thus, a appearing across the terminals of the capacitor C33 at this time, i.e. when first switch S31 is switched from an ON state to an OFF state and is disconnected, is applied to the second negative (−) input terminal of the differential amplifier 51. When switches S31 and S32 are in a connected state, the output of capacitor C33 is grounded.

Figure 8K:

Since the switch S11 (see FIG. 8b) is operated at the time instant $t = T$, and therefore the voltage of the capacitor C13 is rapidly increased (see FIG. 8f) as compared with the voltage of the capacitor C23 (see FIG. 8g), a difference in the waveforms between those shown in FIGS. 8(f) and 8(g) appears as represented in FIG. 8(h). Also, the voltage (see FIG. 8i) appearing between the terminals of the capacitor C32 is decreased because the capacitor C33 is charged via the resistor R33 by this voltage, whereas the voltage (see FIG. 8j) of the capacitor C33 is gradually increased due to its charging effect. As a consequence, from the output of the differential amplifier 51, a summation between the waveforms shown in FIG. 8(h) and FIG. 8(j) is obtained as represented in FIG. 8(k).

A response of a voltage appearing across the terminals of the capacitor C33 for indicating such a state after the switch S11 (see FIG. 8b) has been operated is represented in FIG. 8(j). As apparent from the equation (6), this should be coincident with the function $V_{20(t)}$ of the equation (4). However, due to the restrictions caused by the equations (11) and (13), it is impossible in the equivalent circuit shown in FIG. 9(b) to obtain such a response completely coincident with the function $V_{20(t)}$. Nevertheless, generally speaking, the voltage appearing across the terminals of the capacitor C33 (see FIG. 8(j)) may be substantially coincident with the function $V_{20(t)}$, if the broadband sampling gate circuit is properly designed as follows, since the bandwidth of the second sampling gate 55 has been considerably narrowed, as compared with that of the first sampling gate 11, and also the resistance value R12 is sufficiently smaller than that of the resistance value R13. That is to say, the attenuation ratio of the attenuator 35 is properly designed to be equal to time constants shown in the below-mentioned equations (15) and (16):

$$R_{33}C_{35}=R_{12}(C_{12}+C_{11})C_{13}/(C_{11}+C_{12}+C_{13}) \quad (15)$$

$$R_{34}(C_{32}+C_{33})=R_{13}(C_{11}+C_{12}+C_{13}) \quad (16)$$

Although the broadband sampling gate circuit is operated in the track hold mode, according to the preferred embodiment of the present invention as has been described, this broadband sampling gate circuit may also be operated under the sample hold mode in accordance with the present invention. Then, a similar advantage to that of the track hold mode may be achieved.

As apparent from the foregoing descriptions, in accordance with the present invention, not only can the waveform distortions caused by the signal waves leaked through the capacitance necessarily existing between the input terminal of the sampling gate and the output terminal thereof be eliminated, but also the waveform distortions caused by the sampling operations can be eliminated, so that such a broadband and highly precision sampling gate circuit can be realized.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by letters patent of the United States is:

1. A broadband sampling gate circuit comprising:
    an input terminal to which an input signal corresponding to a signal to be measured is supplied;
    a first sampling gate means connected to the input terminal and having an output terminal from which instantaneous amplitudes of said input signal are sampled to thereby output sampled signals, and having an input/output capacitor connected between said input terminal and said output terminal;
    a first memory capacitor connected between the output terminal of said first sampling gate means and ground, said first memory capacitor being charged by said sampled signals output from the first sampling gate means;
    a first buffer resistor connected to the output terminal of said first sampling gate means;
    a second memory capacitor charged by said sampled signals output from the first sampling gate means through said first buffer resistor;
    a first reset resistor for resetting said second memory capacitor by discharging said second memory capacitor;
    differential amplifier means comprising:
        a first terminal to which said second memory capacitor is connected whereby signals charged into said second memory capacitor are supplied to signals input to said first terminal of the differential amplifier; and
        a second terminal and a third terminal to which two signals are inputted respectively so as to obtain a difference with respect to signals input to said first terminal;
    a second sampling gate means connected to the output of the differential amplifier for producing an output signal;
    a second buffer resistor coupled to the input terminal;
    a third memory capacitor connected to the second buffer resistor and being charged by signals passing through said second buffer resistor;
    first switching means coupled between the input terminal and the second buffer resistor;
    a second reset resistor for resetting said third memory capacitor by discharging said third memory capacitor; and,
    second switching means for applying one of said two signals appearing between terminals of said third memory capacitor to said third terminal of said differential amplifier means when said first switch means is in a disconnection state, and for grounding the terminals of said third memory capacitor when said first switch means is in a connection state.

2. A broadband sampling gate circuit according to claim 1, wherein said first sampling gate comprises a third switch connected to the input terminal and in parallel to the input/output capacitor.

3. The broadband sampling gate circuit according to claim 1, further comprising a first attenuator connected between the input terminal and the second buffer resistor.

4. The broadband sampling gate circuit according to claim 1, further comprising:
    a second attenuator connected to the input terminal;
    a third buffer resistor connected to an output of the second attenuator;
    a fourth memory capacitor connected to the third buffer resistor and being charged by signals passing through the third buffer resistor;
    a third reset resistor for resetting said fourth memory capacitor by discharging said fourth memory capacitor;
    wherein an output from the fourth memory capacitor is applied to the second terminal of the differential amplifier.

5. The broadband sampling gate circuit according to claim 1, wherein the first terminal of the differential amplifier is a positive terminal and the second and third terminals of the differential amplifier are negative terminals.

6. A broadband sampling gate circuit comprising:
    an input terminal to which an input signal corresponding to a signal to be measured is supplied;
    a first sampling gate circuit for sampling said input signal and outputting an output sampled signal;
    a differential amplifier having a first positive terminal for receiving the output sampled signal output from the first sampling gate circuit and having a second negative terminal and a third negative terminal;
    a first equivalent circuit connected between the input terminal and the second negative terminal of the differential amplifier for supplying a first cancellation signal to the second negative terminal of the differential amplifier, to cancel distortions in the output sampled signal output from the first sampling gate circuit; and
    a second equivalent circuit connected between the input terminal and the third negative terminal of the differential amplifier comprising:
        first switching means coupled to the input terminal;
        a first memory capacitor connected to the first switching means and being charged by s signal passing through the first switching means; and
        second switching means for applying a voltage appearing between terminals of the first memory capacitor to the third negative terminal of the differential amplifier when said first switch means is in a disconnection state, and for grounding the terminals of the first memory capacitor when the first switching means is in a connection state.

7. The broadband sampling gate circuit according to claim 6, wherein the second equivalent circuit further comprises:
   a buffer resistor connected between the first switching means and the first memory capacitor, the first memory capacitor being charged by a signal also passing through the buffer resistor; and
   a reset resistor for resetting said first memory capacitor by discharging the first memory capacitor.

8. The broadband sampling gate circuit according to claim 7, wherein the second equivalent circuit further comprises:
   an attenuator connected between the input terminal and coupled to the first switching means.

* * * * *